United States Patent [19]

Chu

[11] Patent Number: 5,670,385
[45] Date of Patent: Sep. 23, 1997

[54] METHOD FOR FABRICATING AN OPTICAL CONTROLLED RESONANT TUNNELING OSCILLATOR

[75] Inventor: Hye-Yong Chu, Daejeon, Rep. of Korea

[73] Assignee: Electronics and Telecommunications Research Institute, Daejeon, Rep. of Korea

[21] Appl. No.: 501,874

[22] Filed: Jul. 13, 1995

Related U.S. Application Data

[62] Division of Ser. No. 345,779, Nov. 22, 1994, Pat. No. 5,569,933.

[30] Foreign Application Priority Data

Oct. 24, 1994 [KR] Rep. of Korea ............ 94-27166

[51] Int. Cl.⁶ ................................................ H01L 31/18
[52] U.S. Cl. ................................. 437/5; 437/127; 437/133
[58] Field of Search ......................... 437/2, 5, 126, 437/127, 133, 904

[56] References Cited

U.S. PATENT DOCUMENTS

| | | | |
|---|---|---|---|
| 4,973,858 | 11/1990 | Chang | 307/311 |
| 5,126,553 | 6/1992 | England et al. | 250/211 |
| 5,144,261 | 9/1992 | Harvey et al. | 331/66 |
| 5,416,338 | 5/1995 | Suzuki et al. | 257/21 |
| 5,446,293 | 8/1995 | Chu et al. | 257/21 |

OTHER PUBLICATIONS

Phase locking between light pulses and a resonant tunneling diode oscillator (Appl.Phys.Lett. 62(1).4 Jan. 1993) pp. 13,14 &15.

*Primary Examiner*—Tuan H. Nguyen
*Attorney, Agent, or Firm*—Antonelli, Terry, Stout & Kraus, LLP.

[57] ABSTRACT

An optical controlled resonant tunneling oscillator utilizing variation of a resonant tunneling oscillator in accordance with a negative differential resistance, a series resistance and a static capacitance varied in response to the intensity of light when light is incident on a resonant tunneling device having a double barrier quantum well structure and a method for fabricating the same are disclosed. The oscillator modulates the frequency over 2 or 3 levels in response to the intensity of incident light as compared to a conventional photoelectric system that modulates the frequency in response to the ON/OFF electric signal, thereby simplifying the system. The oscillator controls the resonant tunneling at high speed level with light enably processing a signal from tens to hundreds of GHz.

1 Claim, 6 Drawing Sheets

GaAs Sub.

— After light radiation
····· Before light radiation

METHOD FOR FABRICATING AN OPTICAL CONTROLLED RESONANT TUNNELING OSCILLATOR

This is a Divisional application of U.S. Ser. No. 08/345,779, filed Nov. 22, 1994, now U.S. Pat. No. 5,569,933.

FIELD OF THE INVENTION

The present invention relates to an optical controlled resonant tunneling oscillator, and more particularly to an optically controlled resonant tunneling oscillator using a varying oscillation characteristic of a resonant tunneling oscillator in accordance with a negative differential resistance, a series resistance and a static capacitance varied with an intensity of light in which the light is incident on a resonant tunneling device having a double barrier quantum well structure and a method for fabricating the same.

BACKGROUND OF THE INVENTION

Since a negative differential characteristic in a double barrier quantum well was first observed, many studies on adapting a resonant tunneling phenomenon capable of transporting an electron at a high speed below $10^{-12}$ seconds to a high speed device have been accomplished.

FIG. 1 shows a current-voltage characteristic curve of a resonant tunneling diode.

As shown in FIG. 1, a resonant tunneling diode using a resonant tunneling phenomenon has a bistable characteristic having two stable states against a load line due to a negative differential characteristic that a current therethrough is decreases regardless of an increase of an applied voltage.

The bistable characteristic has been applied to memory devices logic circuits and high frequency oscillators. Many studies on the bistable characteristic have been accomplished and an oscillation characteristic is disclosed in Appl. Phys. Lett., 58, pp 2291, 1991 by E. R. Brown et al.

FIG. 2 shows a equivalent circuit diagram of the resonant tunneling diode.

An input impedance ($Z_{input}$) is expressed in the following equation (1) and a cut-off frequency ($f_c$) has a value of the input impedance at the time that the real part of the input impedance is 0 and is expressed in following equation (2). A self-resonant frequency ($f_r$) has a value at the time that an imaginary part of the input impedance is 0 and is expressed in following equation (3).

$$Z_{input} = R_s + jwL_s + \frac{R_n[j/(wC)]}{-R_n - j/(wC)} =$$ (1)

$$R_s - \frac{R_n}{1+(wR_nC)^2} + j\left[wL_s - \frac{wR_n^2 C}{1+(wR_nC)^2}\right]$$

$$f_c = \frac{1}{2\pi R_n C}\sqrt{\frac{R_n}{R_s} - 1}$$ (2)

$$f_r = \frac{1}{2\pi R_n C}\sqrt{\frac{R_n^2 C}{L_s} - 1}$$ (3)

At this constant, $R_s$ designates a series resistance, $R_n$ a negative differential resistance of a tunneling diode, C a static capacitance of the diode, $L_s$ an inductance of a packaged circuit, respectively.

Accordingly, it is noted that a negative differential resistance, a series resistance, a static capacitance and an inductance of a circuit are the primary factors for determining the oscillation characteristic of an oscillator. $L_s$ of the primary factors is determined during processing and it is difficult to change the value of $L_s$ of the previously fabricated oscillator by an external factor.

As shown in FIG. 3, in order to modulate the oscillation characteristic, the prior oscillator having a high frequency characteristic inputs a frequency control signal, synthesizes the frequency of the oscillator and the frequency of the control signal and outputs the synthesized frequency.

That is, because the prior resonant tunneling oscillator utilizes a frequency control method for modulating an oscillation characteristic by an ON/OFF electric signal, it imposes restrictions on a frequency modulation at an ultra-high speed and simplification of a system.

SUMMARY OF THE INVENTION

Accordingly, the present invention solves the above problems and it is an object of the present invention to provide an optically controlled resonant tunneling oscillator capable of processing a signal at an ultra-high speed and simplifying a system by controlling a frequency of a resonant tunneling oscillator in response to the intensity of light and a method for fabricating the same.

These and other objects and features of the present invention are achieved by providing an optical controlled resonant tunneling oscillator capable of controlling an oscillator characteristic thereof in accordance with the intensity of light radiated in depletion layers through a window layer, a buffer layer made of GaAs doped with an impurity in a high concentration, first and second spacer layers serving as the accumulation layer, third and fourth spacer layers as the depletion layer successively formed over the semi-insulated substrate in an ordinary mesa structure; first and second barrier layers formed between the second and third spacer layers in a double barrier quantum well structure; a well layer formed at an interface between the first and second barrier layers; and the window layer formed over the fourth spacer layer and made of a material having a wider-band gap so as to make the light incident on the surface thereof nearly absorb in the depletion layer.

The present invention provides a method for fabricating an optically controlled resonant tunneling oscillator, comprising the steps for successively growing a buffer layer made of $n^+$-type GaAs, first and second spacer layers, a first barrier layer, well layer and a second barrier layer having a double quantum well structure, third and fourth spacer layers, and a window layer over a semi-insulated substrate made of GaAs with a molecular beam epitaxy growth; mesa-etching the window layer to the portion of the buffer layer using a photo resist pattern as a mask, thereby forming an ordinary mesa structure and exposing the buffer layer; forming openings on the mesa structure and the exposed buffer layer so as to form ohmic contacts; depositing a multi-metal pattern of AuGe/Ni/Au in the openings; etching the exposed buffer layer and the portion of the underlying substrate except for the mesa structure and the openings, so as to isolate the oscillator; depositing an insulation layer over the whole surface of the substrate; etching the insulation layer, thereby forming contact holes on the multi-metal patterns; forming metal patterns for a bonding pad on the contact holes; and annealing for easy forming a minute pattern and for improving an adhesion force of the metal patterns for a bonding pad.

DETAILED DESCRIPTION OF THE PREFERRED EMBODIMENTS

Figure 1:
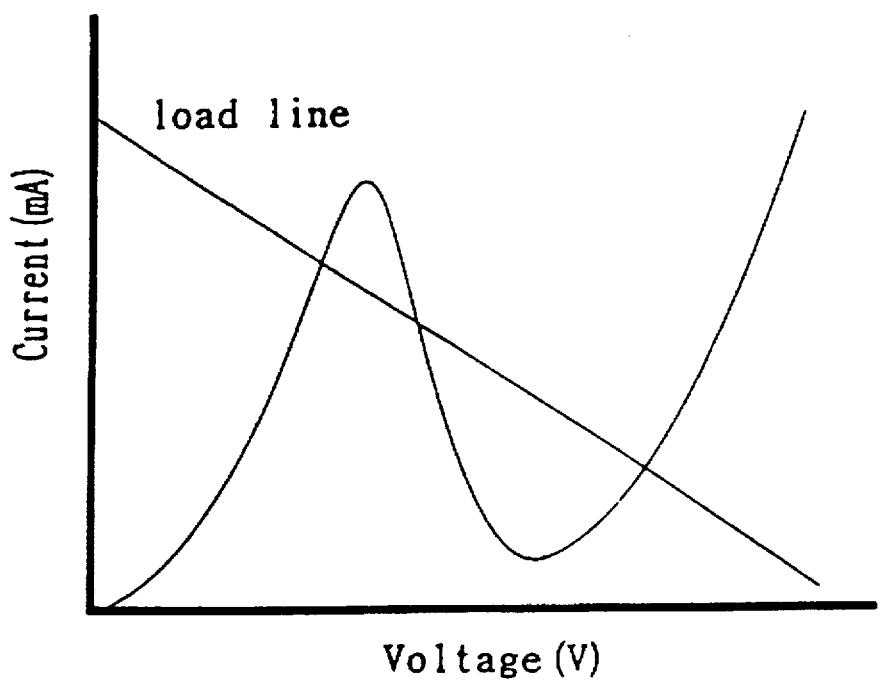
FIG. 1 is a diagram of a conventional current-voltage characteristic curve of a resonant tunneling diode.
Figure 2:
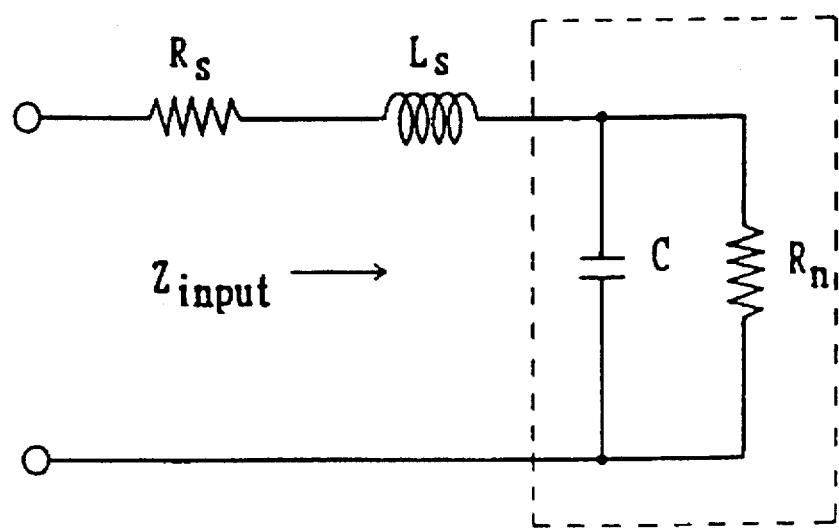
FIG. 2 is an equivalent circuit diagram of FIG. 1.
Figure 3:
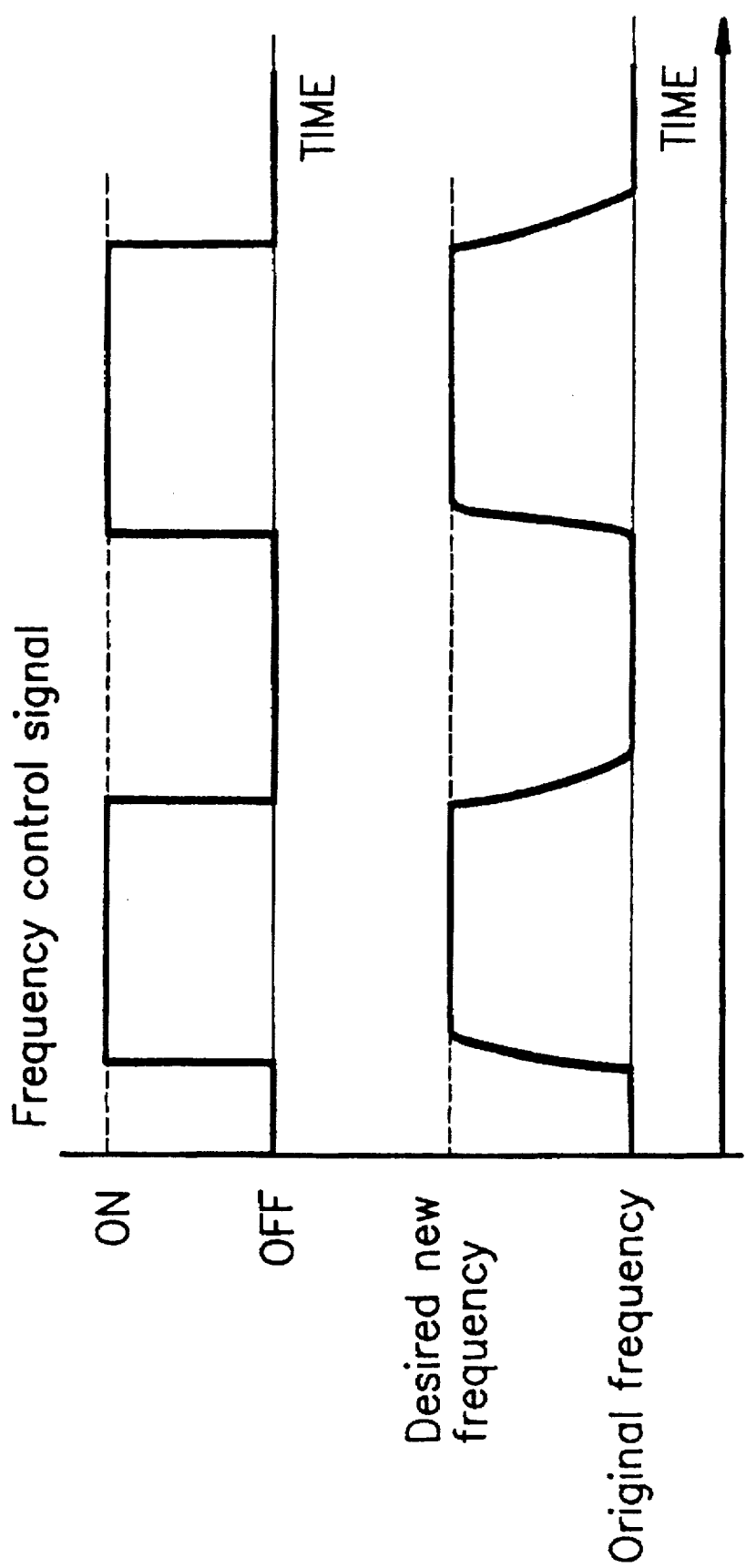
FIG. 3 is waveform diagram of a conventional high frequency oscillator.
Figure 4A:
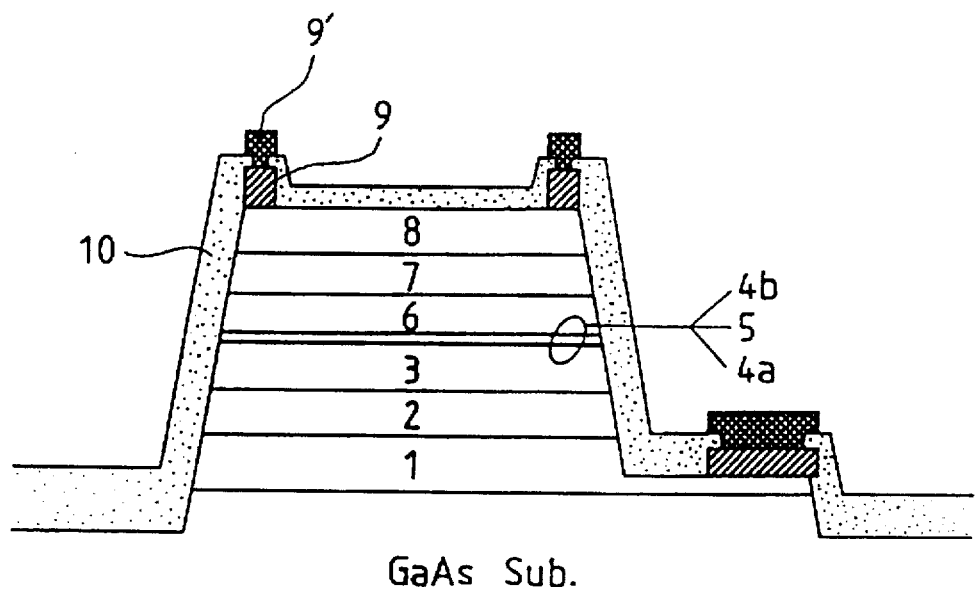
FIGS. 4A and 4B illustrate a configuration diagram of an optically controlled resonant tunneling oscillator using a double barrier quantum well in accordance with the present invention FIG. 4A being a sectional view, and FIG. 4B being a band diagram.
Figure 4B:
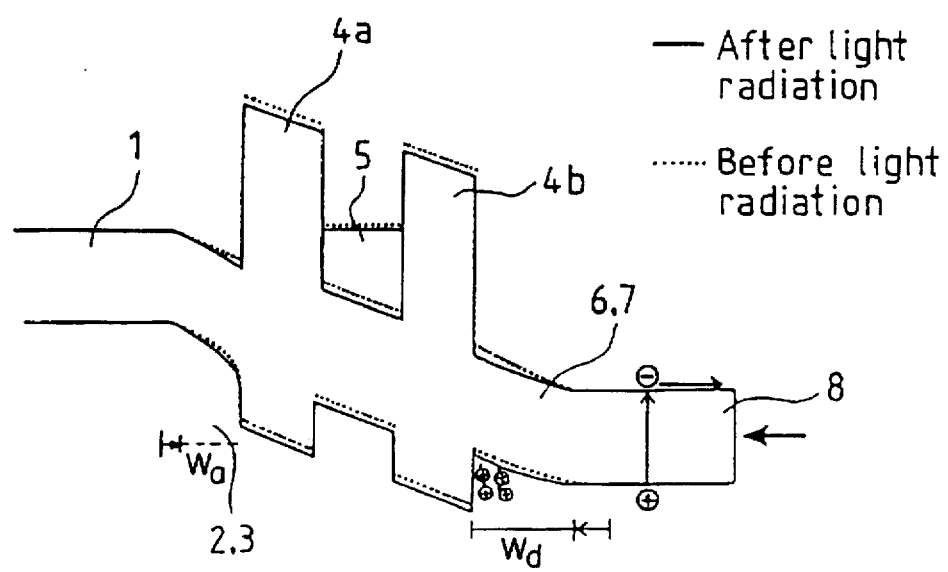

Referring to FIGS. 4A and 4B, there is shown a configuration diagram of an optically controlled resonant tunneling oscillator using a double barrier quantum well structure in accordance with the invention.

FIG. 4A shows a sectional view of an optically controlled resonant tunneling oscillator and FIG. 4B shows a band diagram when a voltage is applied to a positive electrode of FIG. 4A.

The optical controlled resonant tunneling oscillator has a structure on a semi-insulated substrate made of GaAs, a buffer layer 1 made of $n^+$-type GaAs, a first spacer layer 2 made of n-type GaAs, a second spacer layer 3 made of i-type GaAs, a third spacer layer 6 made of i-type GaAs, a fourth spacer layer 7 made of n-type GaAs and a window layer 8 made of $n^+$-type AlGaAs successively formed, and a first barrier layer 4a and a second barrier layer 4b having a double barrier structure formed between the second spacer layer 3 and the third spacer layer 6, and a well layer 5 formed at an interface between the first and the second barrier layers 4a and 4b.

When light is radiated on the surface of the optically controlled resonant tunneling oscillator as above configured, most electron-holes pairs are created in the third and fourth spacer layers 6 and 7.

At this time, if a positive voltage is applied to an electrode 9 on the mesa structure, each of the electron-hole pairs are separated into an electron and a hole. As shown in FIG. 4B, electrons flow to a collector. Some holes are accumulated near a barrier of a collector side against electrons and a remainder of holes flow to an emitter by a resonant tunneling or a non-resonant tunneling.

Conductivity of the lightly doped fourth spacer layer 7 and the undoped third spacer layer 6 is increased by optically created electrons, so that the series resistance is decreased. Space charges accumulate in the well layer 5 due to holes accumulated in the barrier of the collector side so as to preserve charge neutrality, thereby causing a potential distribution of a double barrier quantum well to be rapidly changed.

Accordingly, as shown in FIG. 4B, the width $W_a$ of the accumulation layer and the width $W_d$ of the depletion layer is reduced, thereby increasing static capacitance C.

The static capacitance C is expressed in the following equation. Herein, $\epsilon$ is a dielectric constant, A an area of a device and d a width $W_a$ of the accumulation layer, respectively.

$$C = \epsilon A / d$$

As the potential distribution of the double barrier quantum well structure is changed by the holes accumulating in the barrier of the collector side and reduction of the series resistance, a condition of a resonant tunneling at the lower voltage should be satisfied before the radiation of the light.

Figure 5:
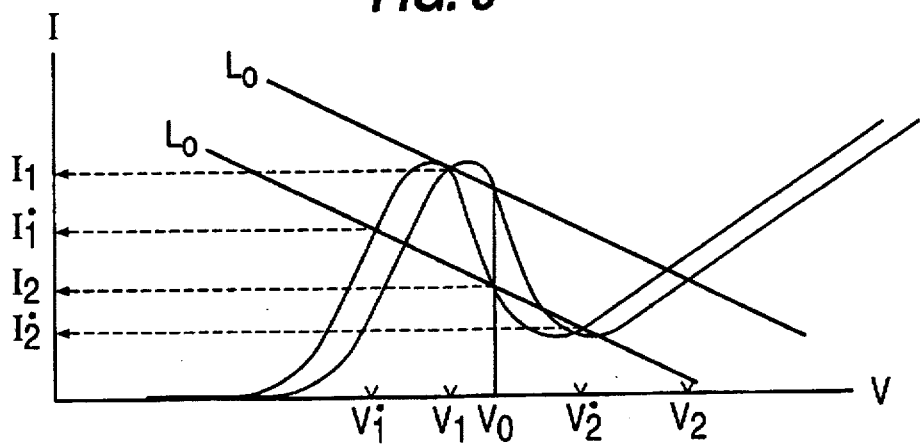
FIG. 5 is a diagram of a DC current-voltage characteristic curve of an optically controlled resonant tunneling oscillator in accordance with the present invention.

Accordingly, as shown in FIG. 5, the DC current-voltage characteristic curve of the present optically controlled resonant tunneling device generally transits at a lower voltage.

Thus, if the bias Vo is applied to the oscillator, the negative differential resistance $R_n$ is changed from $(V_2-V_1)/(I_2-I_1)$ to $(V_2'-V_1')/(I_2'-I_1')$ against the load line Lo.

However, in general, the DC current-voltage characteristic curve of the resonant tunneling oscillator has a slope larger when the applied voltage is smaller than the peak voltage, than the applied voltage is larger than the barrier voltage.

Accordingly, if the current-voltage curve transits to the lower voltage due to the radiation of the light, the variation of the voltage $(V_2-V_2')$ is larger than the variation of the current $(I_2-I_2')$ in the region that the applied voltage is larger than the peak voltage, thereby decreasing the load resistance $R_n$ against the applied voltage Vo and the load line Lo.

As the result, if the light having a higher energy than the energy band gap of the spacer layers (2, 3, 6, 7) is radiated on the surface of the resonant tunneling device, the series resistance is reduced due to the optically created electrons and holes and the static capacitance and the negative differential resistance are increased. Accordingly, when the light is radiated on the surface of the resonant tunneling device, the oscillation characteristic is changed by the equations (2) and (3).

The output characteristic of the resonant tunneling oscillator is determined by the self-resonant frequency of the equation (3), so that the frequency of the device is reduced by the radiation of the light.

Figure 6:
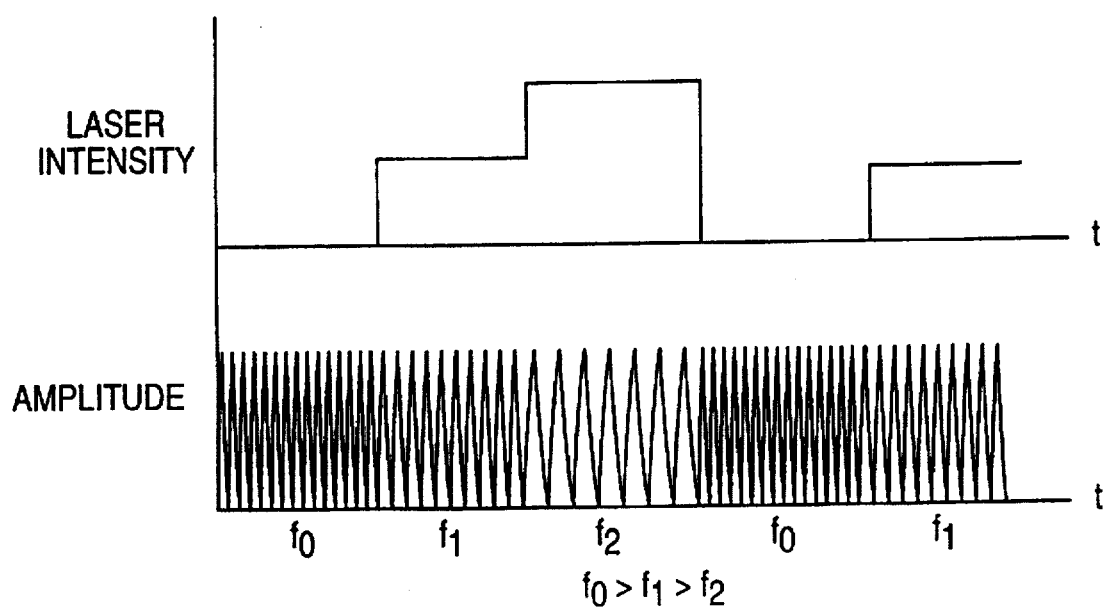
FIG. 6 is waveform diagram of an optically controlled resonant tunneling oscillator in accordance with the present invention.

The frequency characteristic can be controlled in accordance with the intensity of the light as shown in FIG. 6 before the mechanism for electron-hole pairs is in a saturated state.

As compared with the conventional method that modulates the frequency by an ON/OFF electical control signal, the optical resonant tunneling oscillator frequency that is controlled by the intensity of the light can modulate the frequency over 2 or 3 levels in response to the intensity of the control light, thereby simplifying the system and permitting controlling the resonant tunneling at an ultra-high speed by the light, thereby processing the signal at the ultra-high speed of tens to hundreds of GHz.

FIGS. 7A to 7H are sectional views, respectively, illustrating a method for fabricating an optical controlled resonant tunneling oscillator in accordance with the present invention.

In accordance with this method, first, the buffer layer 1 which is made of $n^+$-type GaAs doped with an n-type impurity in a concentration of $4 \times 10^{18}$ $cm^{-3}$, is grown to a thickness of 10000 Å over a semi-insulated substrate made of GaAs. Over the buffer layer 1, the first spacer layer 2 made of $n^+$-type GaAs doped with an n-type impurity in a concentration of $4 \times 10^{17}$ $cm^{-3}$ and the second spacer layer 3 made of the undoped GaAs, are successively grown to a thickness of 1000 Å and 100 Å, respectively.

The double barrier quantum well structure is achieved by symmetrically growing the first and the second barrier layers 4a and 4b, respectively, to a thickness of 40 Å and the well layer 5 made of GaAs and serving as a quantum well, is grown between the first and second barrier layers 4a and 4b. In order to reduce the non-resonant tunneling, the first and second barrier layers are made of AlAs having a higher barrier.

The third spacer layer 6 and the fourth spacer layer 7 are successively grown over the double barrier quantum well. In order to further increase the voltage drop in the double barrier quantum well in response to the radiation of the light by enlarging the length of the depletion layer formed at voltage application, the third spacer layer 6 is made of the undoped GaAs having a thickness of 500 Å and the fourth spacer layer 7 is made of n-type GaAs highly-doped with an n-type impurity in a concentration of $4\times10^{17}$ cm$^{-3}$ and has a thickness of 1000 Å.

Subsequently, the window layer 8 is grown to a thickness of 5000 Å over the fourth spacer layer 7. The window layer is made of $Al_{0.15}Ga_{0.85}As$ which is highly doped with an n-type impurity in a concentration of $2\times10^{18}$ cm$^{-3}$ and has a wider-band gap so as to make the incident light not be absorbed in the surface but in the depletion layer.

Figure 7A:
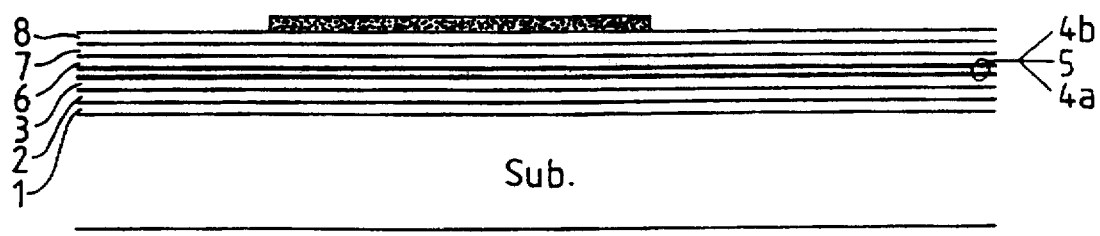
FIGS. 7A to 7H are sectional views, respectively, illustrating a method for fabricating an optically controlled resonant tunneling oscillator in accordance with the present invention.

Accordingly, the sectional structure as shown in FIG. 7A obtained.

Figure 7B:
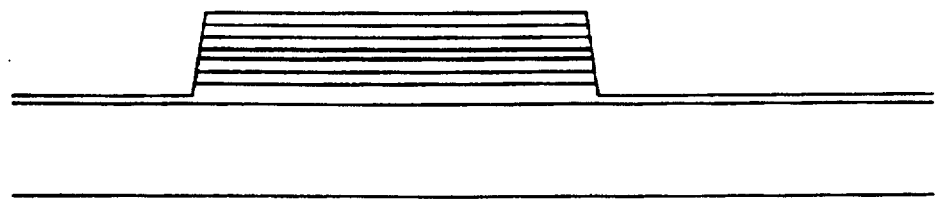

As shown in FIG. 7B, for formation of the mesa structure using the predetermined photo resist pattern, the window layer 8, the fourth and third gap layer 7 and 6, the second barrier layer 4b, the well layer 5, the first barrier layer 4a, the second and first spacer layer 3 and 2 and the buffer layer 1 are sequentially etched using an etchant solution of $H_3PO_4:H_2O_2:H_2O$ mixed at the volume ratio at room temperature under a condition that the predetermined photoresist pattern is used as a mask.

Noticeably, the buffer layer 1 is partially etched to a depth of about 10000 Å.

Figure 7C:
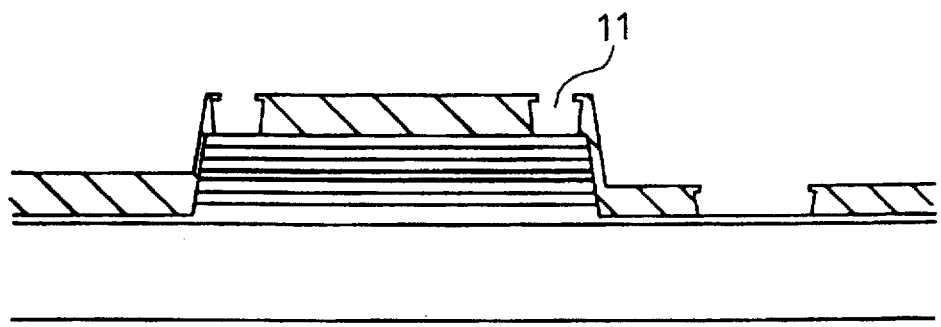

As shown in FIG. 7C, a photoresist film is coated over the whole surface and then is subjected to a photo-etching so as to form the openings 11 for formation of the electrode on the mesa structure and the exposed the buffer layer 1 by carrying out the foregoing photo-etching.

At this time, the openings 11 are formed with the edge portion of the mesa structure so as to make light sufficiently radiate the underlying the window layer 8 and make the voltage uniformly applied to the electrode.

Figure 7D:
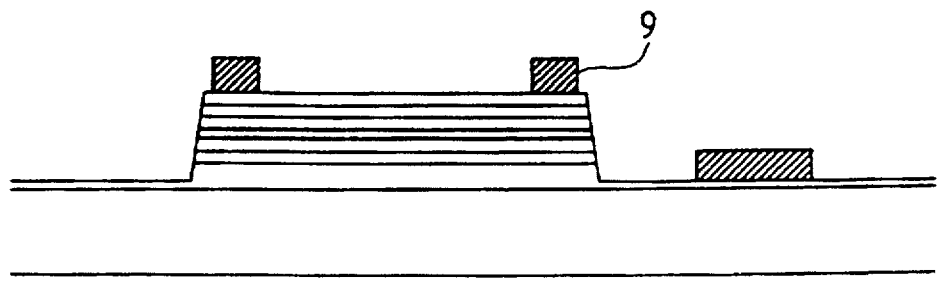

As shown in FIG. 7D, for formation of ohmic contacts on the openings 11, 88 Au:12 Ge/Ni/Au is deposited using a thermal deposition method to a thickness of 1500 Å/500 Å/3000 Å, respectively.

The deposited layer are subjected to a lift-off by dipping in acetone so as to form the metal pattern 9 as shown in FIG. 7D.

Figure 7E:
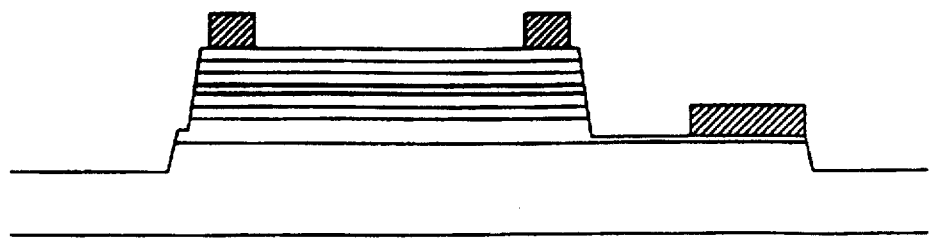

Referring to FIG. 7E, in order to isolate between the devices and reduce the static capacitance due to a wire bonding pad, the photo-etching process is carried out in a mesa-etching manner as shown in FIG. 7B using the photo resist pattern. Then the exposed buffer layer 1 and the unlerlying semi-insulated substrate are etched using the above mesa etching solution.

Figure 7F:
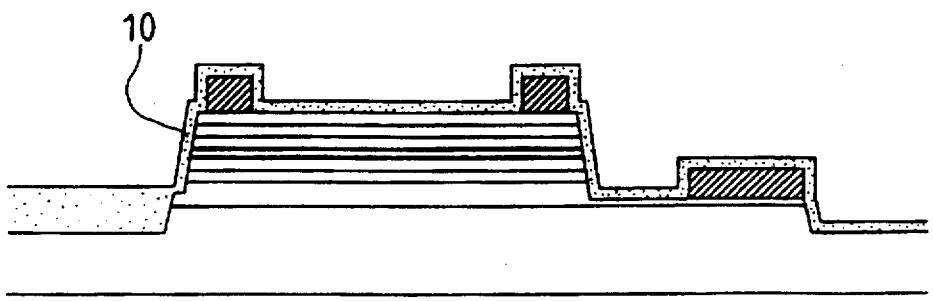

Referring to FIG. 7F, the $SiO_2$ layer 10 is deposited over the whole surface to a thickness of about 3000 Å using a low temperature chemical vapor deposition or plasma chemical vapor deposition.

Figure 7G:
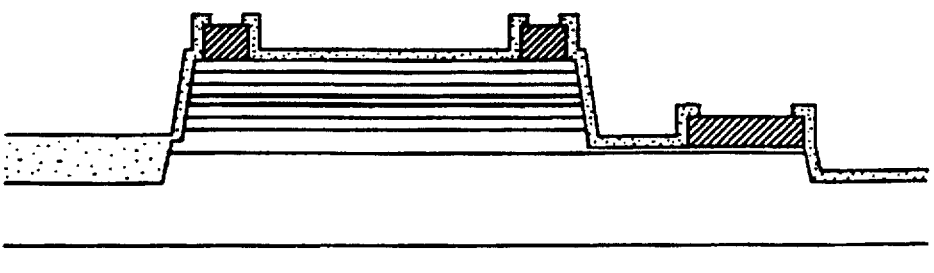

Referring to FIG. 7G, for connection of an ohmic contact metal and a bonding pad metal, a photo resist film is coated over the whole surface. The photoresist film is then subjected to a photo-etching so as to form the openings of the photo resist film over the metal patterns 9 and the exposed $SiO_2$ layer is etched using a buffered oxide etchant BOE.

Figure 7H:
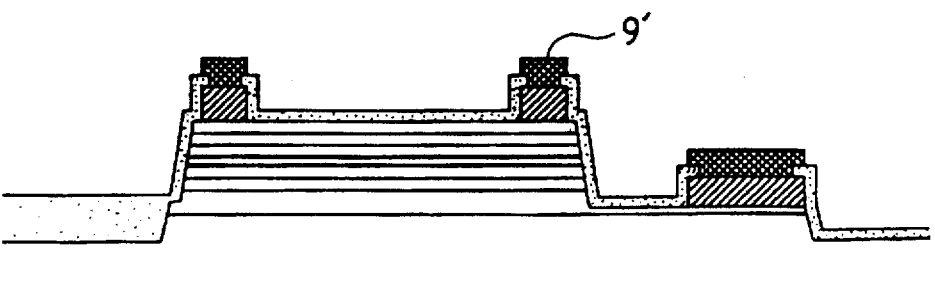

Referring to FIG. 7H the photolithography process is carried out in the same manner as shown in FIG. 7C so as to form the bonding pod. Then Ti/Au are respectively deposited over the whole surface to a thickness of 500 Å/3000 Å using an electron beam vacuum deposition method.

The Ti/Au layer is subjected to a lift-off process by dipping in an acetone so as to form the metal patterns 9' for a bonding pad on the metal patterns 9.

Subsequently, the metal patterns 9 for an ohmic contact are subjected to an annealing during about 20 to 40 seconds using a rapid thermal annealing.

After formation of the metal patterns, if annealing is performed, the surface of the metal pattern is deteriorated annealing, and therefore during forming of a minute pattern the following photo-etching process is not possible.

Accordingly, after the completion of all photo-etching, the annealing should be carried out so as to easily form a minute pattern.

After the formation of the metal pattern for a bonding pad, the annealing is carried out so as to increase an adhesion force of the metal pattern for a bonding pad, so that the optical controlled resonant tunneling oscillator of this invention can be fabricated.

According to the present invention, the high frequency characteristic of the resonant tunneling can be modulated in response to the intensity of the light. Therefore, an optical resonant tunneling oscillator can exhibit the optical controlled oscillation characteristic at an ultra-high speed, as compared with a convnetional frequency modulation method.

Thus, an optically controlled resonant tunneling oscillator of the present invention controls at high speed the resonant tunneling with light, thereby processing the signal at the high speed of ten to hundreds GHz.

Furthermore, the frequency can be modulated to 2 or 3 levels in response to the intensity of the light, thereby simplifying the system.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating an optically controlled resonant tunneling oscillator comprising the steps:

successively growing a buffer layer made of $n^+$-type GaAs, first and second spacer layers, a first barrier layer, a well layer and a second barrier layer having a double quantum well, third and fourth spacer layers, and a window layer over a semi-insulated substrate made of GaAs with a molecular beam epitaxy growth;

mesa-etching the window layer to a portion of the buffer layer using a photoresist pattern as a mask, thereby forming a mesa structure and exposing the buffer layer;

forming openings of a photoresist on the mesa structure and an exposed buffer layer so as to form electrodes;

depositing a multi-metal of AuGe/Ni/Au over a surface and then subjecting the multi-metal to a lift off processing;

etching the exposed buffer layer and a portion of the underlying substrate except for the mesa structure and the openings, so as to isolate the oscillator;

depositing an insulation layer over a whole surface of the substrate;

etching the insulation layer using a photoresist pattern as a mask, thereby forming contact holes on the multi-metal;

forming metal patterns for a bonding pad on the contact holes; and performing annealing of optically controlled resonant tunneling oscillator after completion of all photo-etching.

* * * * *